US012782434B2

(12) United States Patent
Mueller

(10) Patent No.: US 12,782,434 B2
(45) Date of Patent: Nov. 3, 2026

(54) METHOD FOR TESTING A SUBSTRATE, AND APPARATUS FOR TESTING A SUBSTRATE

(71) Applicant: Applied Materials, Inc., Santa Clara, CA (US)

(72) Inventor: Bernhard G. Mueller, Finsing (DE)

(73) Assignee: Applied Materials, Inc., Santa Clara, CA (US)

( * ) Notice: Subject to any disclaimer, the term of this patent is extended or adjusted under 35 U.S.C. 154(b) by 162 days.

(21) Appl. No.: 18/863,390

(22) PCT Filed: May 10, 2022

(86) PCT No.: PCT/EP2022/062609
§ 371 (c)(1),
(2) Date: Nov. 6, 2024

(87) PCT Pub. No.: WO2023/217354
PCT Pub. Date: Nov. 16, 2023

(65) Prior Publication Data
US 2025/0298078 A1 Sep. 25, 2025

(51) Int. Cl.
*G01R 31/307* (2006.01)
*G01R 31/28* (2006.01)

(52) U.S. Cl.
CPC ....... *G01R 31/307* (2013.01); *G01R 31/2896* (2013.01)

(58) Field of Classification Search
None
See application file for complete search history.

(56) References Cited

U.S. PATENT DOCUMENTS 6,172,363 B1 * 1/2001 Shinada ............... G01R 31/307 850/10
6,859,052 B1 2/2005 Vaucher
(Continued)

FOREIGN PATENT DOCUMENTS

JP 2002313862 A 10/2002
KR 1020210008044 A 1/2021

OTHER PUBLICATIONS

Anonymous, Photoelectric Test Method for PCB Conductors, IBM Technical Disclosure Bulletin, International Business Machines Corp. ( Thornwood) , US, vol. 27, No. I0B, Mar. 1, 1985 (Mar. 1, 1985), pp. 5959-5960.
(Continued)

*Primary Examiner* — Muhammad Adnan
(74) *Attorney, Agent, or Firm* — Patterson + Sheridan, LLP

(57) ABSTRACT

A method of testing a substrate, particularly a packaging substrate, with at least one electron beam column is described. The packaging substrate can be a panel level packaging substrate or an advanced packaging substrate. The method includes: placing the substrate on a stage in a vacuum chamber; directing the electron beam of the at least one electron beam column with a landing energy $U_{pe}$, a first beam diameter $BD_1$ and a first impact angle $\theta_1$ on one or more first surface contact points on the substrate; directing the electron beam with at least one of a second beam diameter $BD_2$ and a second impact angle $\theta_2$ on one or more second surface contact points different from the one or more first surface contact points, wherein at least one of the following applies: i) the first impact angle $\theta_1$ is different from the second impact angle $\theta_2$, and ii) the second beam diameter $BD_2$ is different from the first beam diameter $BD_1$; and detecting signal electrons emitted upon impingement of
(Continued)

the electron beam for testing at least a first device-to-device electrical interconnect path of the substrate.

19 Claims, 6 Drawing Sheets

(56) References Cited

U.S. PATENT DOCUMENTS

| | | | | |
|---|---|---|---|---|
| 12,293,953 | B2 * | 5/2025 | Tellkamp | H10W 70/411 |
| 12,455,313 | B2 * | 10/2025 | Mueller | G01R 31/2896 |
| 2005/0017729 | A1 | 1/2005 | Tsuji et al. | |
| 2006/0172443 | A1 * | 8/2006 | Ramappa | G01R 31/307 438/14 |
| 2007/0013404 | A1 * | 1/2007 | Yoon | G01R 31/2896 324/759.03 |
| 2008/0006427 | A1 | 1/2008 | Vaucher et al. | |
| 2013/0202321 | A1 | 8/2013 | Suhara et al. | |
| 2019/0064258 | A1 * | 2/2019 | Liao | G01R 31/2896 |
| 2019/0295908 | A1 * | 9/2019 | Rathert | G01R 31/2831 |
| 2021/0265000 | A1 * | 8/2021 | Yu | G01R 31/2896 |
| 2021/0302468 | A1 * | 9/2021 | Oh | G01R 1/0416 |
| 2022/0026488 | A1 * | 1/2022 | Kim | G01R 31/2856 |
| 2023/0266386 | A1 * | 8/2023 | Unokuchi | G01R 1/0466 324/756.07 |
| 2024/0145317 | A1 * | 5/2024 | Shin | G01R 1/0491 |
| 2025/0004044 | A1 * | 1/2025 | Hosamani | H05K 1/0268 |
| 2025/0251446 | A1 * | 8/2025 | Mueller | G01R 31/2896 |
| 2025/0362342 | A1 * | 11/2025 | Wenzel | G01R 31/2831 |
| 2025/0370038 | A1 * | 12/2025 | Wang | G01R 31/2896 |
| 2026/0118418 | A1 * | 4/2026 | Lim | G01R 31/2853 |

OTHER PUBLICATIONS

International Search Report and Written Opinion for International Application No. PCT/EP2022/062609 dated Jan. 5, 2023.

Norio Kuji, et al., A Fully-Automated Electron Beam Test System for VLSI Circuits, IEEE Design & Test of Computers, IEEE Service Center, New York, NY, US, vol. 2, No. 5, Oct. 1, 1985 (Oct. 1, 1985), pp. 74-82.

Korean Office Action from Application No. 10-2024-7040404 mailed Sep. 15, 2025 (44020657KR01).

* cited by examiner

METHOD FOR TESTING A SUBSTRATE, AND APPARATUS FOR TESTING A SUBSTRATE

FIELD

The present disclosure relates to a method and an apparatus for testing a substrate, particularly a packaging substrate. More particularly, embodiments described herein relate to the contactless testing of electric interconnections in a substrate, particularly a packaging substrate, i.e. a panel-leveling packing (PLP) substrate or an advanced packaging (AP) substrate by using electron beams, particularly for identifying and characterizing defects such as shorts, opens, and/or leakages. Specifically, embodiments of the disclosure relate to methods of testing a substrate, particularly a packaging substrate, the packaging substrate being a panel level packaging substrate or an advanced packaging substrate, to apparatuses for testing a substrate, particularly a packaging substrate, in accordance with methods described herein, and apparatuses for contactless testing of a substrate, particularly a packaging substrate.

BACKGROUND

In many applications, it is necessary to inspect a substrate to monitor the quality of the substrate. Since defects may e.g. occur during the processing of the substrates, e.g. during structuring or coating of the substrates, an inspection of the substrate for reviewing the defects and for monitoring the quality may be beneficial.

Semiconductor packaging substrates and printed circuits boards for the manufacture of complex microelectronic and/or micro-mechanic components are typically tested during and/or after manufacturing for determining defects, such as shorts or opens, in metal paths and interconnects provided at the substrate. For example, substrates for the manufacture of complex microelectronic devices may include a plurality of interconnect paths for connecting semiconductor chips or other electrical devices that are to be mounted on the packing substrate.

Various methods for testing such components are known. For example, contact pads of a component to be tested may be contacted with a contact probe, in order to determine whether the component is defective or not. Since the components and the contact pads are becoming smaller and smaller due to the progressing miniaturization of components, contacting the contact pads with a contact probe may be difficult, and there may even be a risk that the device under test gets damaged during the testing.

The complexity of packaging substrates is increasing and design rules (feature size) are decreasing substantially. Within such substrates, the surface contact points (for later flip chip or other chip mounting) are connected to other surface contact points on the packaging substrate to interconnect semiconductor (or other) devices. Standard methods like electrical-mechanical probing for electrical testing cannot satisfy the requirements of volume production testing, as the throughput decreases (higher number of test points) and contacting reliability decreases (smaller contact size). Beyond the reduced size and the problem of potentially damaging contact pads, the topography of the packaging substrates results in difficulties for other test methods, like test methods utilizing capacitive detectors or electrical field detectors, because such methods beneficially have a small mechanical spacing.

Accordingly, it would be beneficial to provide testing methods and testing apparatuses that are suitable for reliably and quickly testing complex microelectronic devices, particularly packaging substrates such as AP substrates and PLP substrates.

SUMMARY

In light of the above, a method and apparatuses for testing a substrate, particularly a packaging substrate, are provided according to the independent claims. Further aspects, advantages, and beneficial features are apparent from the dependent claims, the description, and the accompanying drawings.

According to an embodiment, a method of testing a substrate, particularly a packaging substrate, with at least one electron beam column is provided. Typically, the packaging substrate is a panel level packaging substrate or an advanced packaging substrate. The method includes: placing the substrate on a stage in a vacuum chamber; directing an electron beam of the at least one electron beam column with a landing energy $U_{pe}$, a first beam diameter $BD_1$ and a first impact angle $\theta_1$ on one or more first surface contact points on the packaging substrate; directing the electron beam with at least one of a second beam diameter $BD_2$ and a second impact angle $\theta_2$ on one or more second surface contact points different from the one or more first surface contact points, wherein at least one of the following applies: i) the first impact angle $\theta_1$ is different from the second impact angle $\theta_2$, and ii) the second beam diameter $BD_2$ is different from the first beam diameter $BD_1$. Further, the method includes detecting signal electrons emitted upon impingement of the electron beam for testing at least a first device-to-device electrical interconnect path of the packaging substrate.

According to an embodiment, an apparatus for testing a substrate, particularly a packaging substrate, is provided. The apparatus is configured for testing in accordance with a method of testing according to any of the embodiments of the present disclosure.

According to an embodiment, an apparatus for contactless testing of a substrate, particularly a packaging substrate, is provided. The apparatus includes a vacuum chamber; a stage within the vacuum chamber, the stage being configured to support the substrate, particularly the substrate being a panel level packaging substrate or an advanced packaging substrate; and a charged particle beam column configured to generate an electron beam. The apparatus, particularly the electron beam column, includes an objective lens configured to focus the electron beam on the substrate and a scan deflector configured to scan the electron beam to different positions on the packaging substrate. Further, the apparatus includes an electron detector for detecting signal electrons emitted upon impingement of the electron beam on the packaging substrate; and one or more power supplies to provide a landing energy $U_{pe}$ of the electron beam. The apparatus further includes a controller configured to control the scan deflector and the objective lens for: a) directing the electron beam with a first beam diameter and a first impact angle $\theta_1$ on one or more first surface contact points on the packaging substrate, and b) directing the electron beam with at least one of a second beam diameter and a second impact angle $\theta_2$ on one or more second surface contact points different from the one or more first surface contact points. At least one of the following applies: i) the first impact angle $\theta_1$ is different from the second impact angle $\theta_2$, and ii) the second beam diameter $BD_2$ is different from the first beam diameter $BD_1$.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus and a method for manufacturing the apparatuses and devices described herein. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION

Figure 1:
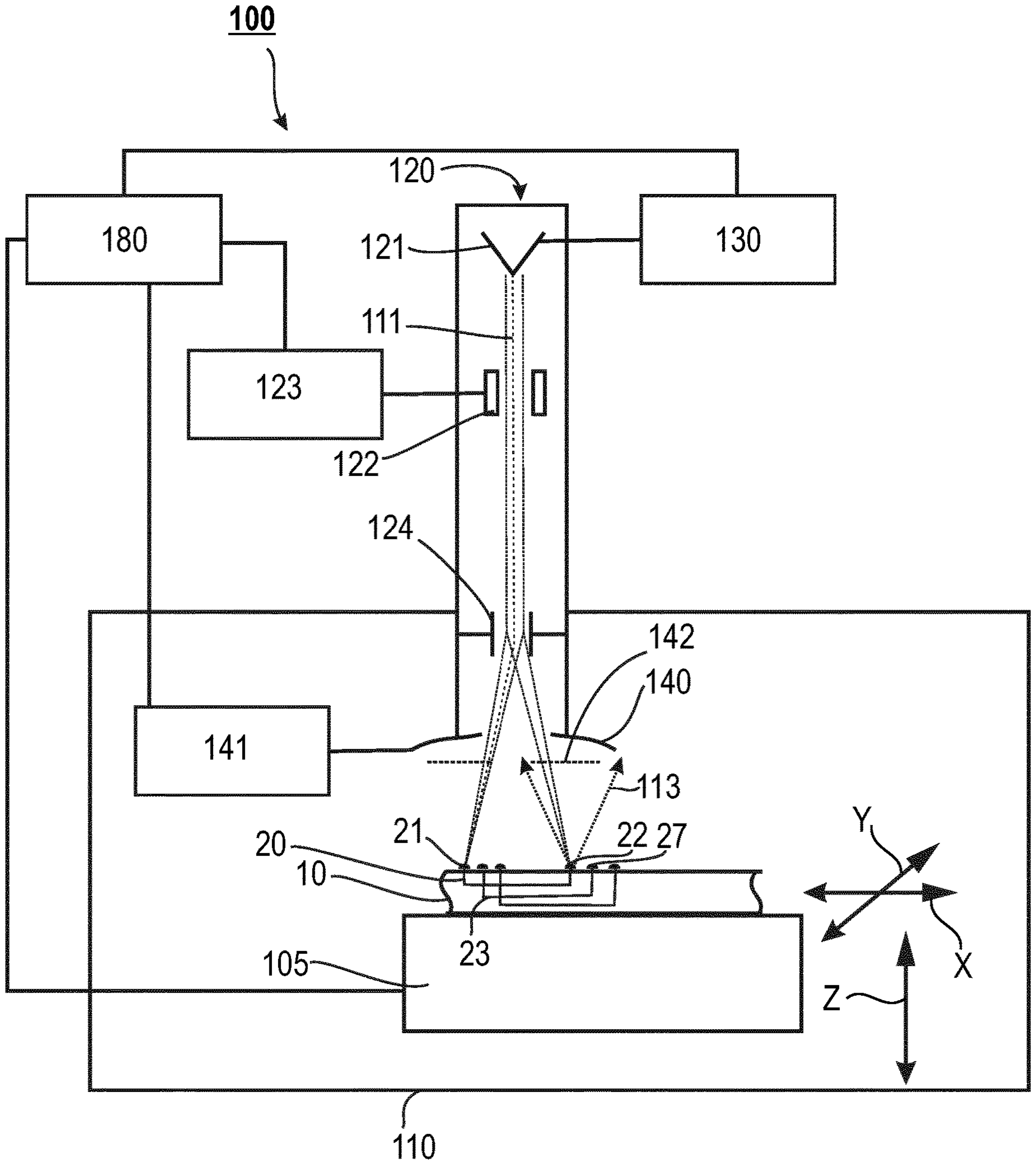
FIG. 1 shows a schematic sectional view of an apparatus for testing a substrate in accordance with any of the testing methods described herein.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. The intention is that the present disclosure includes such modifications and variations.

Within the following description of the drawings, the same reference numbers refer to same components. Only the differences with respect to the individual embodiments are described. The structures shown in the drawings are not necessarily depicted true to scale but rather serve the better understanding of the embodiments.

The complexity of packaging substrates has been increasing for years, with the aim of reducing the space requirements of semiconductor packages. For reducing the manufacturing costs, packaging techniques were proposed, such as 2.5D ICs, 3D-ICs, and wafer-level packaging (WLP), e.g. fan-out WLP. In WLP techniques, the integrated circuit is packaged before dicing. A "packaging substrate" as used herein relates to a packaging substrate configured for an advanced packaging technique, particularly an WLP-technique or a panel-level-packing (PLP)-technique.

"2.5D integrated circuits" (2.5D ICs) and "3D integrated circuits" (3D ICs) combine multiple dies in a single integrated package. Here, two or more dies are placed on a packaging substrate, e.g. on a silicon interposer or a panel-level-packaging substrate. In 2.5D ICs, the dies are placed on the packaging substrate side-by-side, whereas in 3D ICs at least some of the dies are placed on top of each other. The assembly can be packaged as a single component, which reduced costs and size as compared to a conventional 2D circuit board assembly.

A packaging substrate typically includes a plurality of device-to-device electrical interconnect paths for providing electrical connections between the chips or dies that are to be placed on the packaging substrate. The device-to-device electrical interconnect paths may extend through a body of the packaging substrate in a complex connection network, vertically (perpendicular to the surface of the packaging substrate) and/or horizontally (parallel to the surface of the packaging substrate) with end points (referred to herein as surface contact points) exposed at the surface of the packing substrate.

An advanced packaging (AP) substrate provides the device-to-device electrical interconnection paths on or within a wafer, such as a silicon wafer. For example, an AP substrate may include Through Silicon Vias (TSVs), e.g., provided in a silicon interposer, other conductor lines extending through the AP substrate. A panel-level-packaging substrate is provided from a compound material, for example material of a printed circuit board (PCB) or another compound material, including, for example ceramics and glass materials.

Panel-level-packaging substrates are manufactured that are configured for the integration of a plurality of devices (e.g., chips/dies that may be heterogeneous, e.g. may have different sizes and configurations) in a single integrated package. Further, AP substrates may be combined on a PLP substrate. A panel-level substrate typically provides sites for a plurality of chips, dies, or AP substrates to be placed on a surface thereof, e.g. on one side thereof or on both sides thereof, as well as a plurality of device-to-device electrical interconnect paths extending through a body of the PLP substrate.

Notably, the size of a panel-level-substrate is not limited to the size of a wafer. For example, a panel-level-substrate may be rectangular or have another shape. Specifically, a panel-level-substrate may provide a surface area larger than the surface area of a typical wafer, e.g., 1000 $cm^2$ or more. For example, the panel-level substrate may have a size of 30 cm×30 cm or larger, 60 cm×30 cm or larger, 60 cm×60 cm or larger.

The present disclosure relates to methods and apparatuses for testing packaging substrates that are configured for the integration of a plurality of devices in one integrated package, and that include at least one device-to-device electrical interconnect path. It is to be understood, that the methods and apparatuses described herein employing the principle of charge control by topography can be used in all SEM related application with electrical components and topography. According to embodiments of the present disclosure, a test system, test apparatus, or test method may detect and/or classify defective electrical connections in a packaging substrate, such as opens, shorts, leakage defects, or others. Particularly, the test methods and test systems may provide a contactless testing. A contact pad pitch of 60 μm or below or even about 10 μm or below is difficult and even impossible for mechanical probing. Also, the small contact pads must not be damaged by any scratch. Contactless testing is beneficial.

According to embodiments of the present disclosure, E-beam testing and/or E-beam review provides for testing of contact pads of 60 μm or below or even about 10 μm or below. Voltage contrast testing imaging can be provided. Testing can be provided at or between "surface contact points" of the packaging substrate.

A "surface contact point" may be understood as an end point of an electrical interconnect path that is exposed at a surface of the packaging substrate, such that an electron beam can be directed on the surface contact point for contactless charging or probing the electrical interconnect path. A "surface contact point" can be an intermediate contact within a complex network. Further, a "surface contact point" can be on the top side of the substrate or on the bottom side of the substrate. For example, a "surface contact point" can provided on or connected with a $V_{DD}$ line or a $V_{SS}$ line for device power supply. $V_{SS}$ stands for the voltage applied to a transistor source. $V_{DD}$ stands for voltage applied to a transistor drain. A surface contact point is configured to electrically contact a chip, a die, a smaller package, or other electrical components like capacitors, resistors, coils, or the like, that is to be placed on the surface of the packaging substrate, e.g. via soldering. Electrical components may also include active electrical components, such as a transformer changing the voltage in a region of the package. In some embodiments, the surface contact points may be or may include solder bumps.

According to embodiments of the present disclosure, 100% of the electrical interconnect paths are tested. The costs of ownership of device packages including the chips etc., such as processors, memories, or the like (microelectronic devices), is mainly determined by the highly integrated microelectronic devices. Accordingly, mounting a non-defective microelectronic device to a defective packaging substrate is disadvantageous with respect to manufacturing cost. A fully non-defective packaging substrate is desirable before mounting of the microelectronic devices.

According to an embodiment, a method for the testing of a substrate, particularly a packaging substrate, is provided, the packaging substrate being a panel level packaging substrate or an advanced packaging substrate. The packaging substrate is tested with at least one electron beam column. The method includes placing the packaging substrate on a stage in a vacuum chamber. Additionally, the method includes directing an electron beam of the at least one electron beam column with a landing energy $U_{pe}$, a first beam diameter $BD_1$ and a first impact angle $\theta_1$ on one or more first surface contact points on the packaging substrate. Further, the method includes directing the electron beam with at least one of a second beam diameter $BD_2$ and a second impact angle $\theta_2$ on one or more second surface contact points different from the one or more first surface contact points. When the method is conducted, at least one of the following applies: i) the first impact angle $\theta_1$ is different from the second impact angle $\theta_2$, and ii) the second beam diameter $BD_2$ is different from the first beam diameter $BD_1$. Moreover, the method includes detecting signal electrons emitted upon impingement of the electron beam for testing at least a first device-to-device electrical interconnect path of the packaging substrate.

According to embodiments of the present disclosure, testing of features, for example, electrical interconnection paths, of the packaging substrate can be provided, wherein charge up of features and/or the packaging substrate can be controlled. Variation of at least one of the impact angle θ and the beam diameter of the electron beam on the surface contact points can be utilized to control the charge on the packaging substrate or respective portions thereof, particularly the surface contact points. Accordingly, a contactless electrical test with an electron-beam can be provided. The test may include a voltage signal reading, i.e. a voltage contrast measurement upon detection of signal electrons, for example, secondary electrons. Test positions, i.e. surface contact points, of an advanced packaging substrate or panel level packaging substrate can be charged without contact to avoid damage to the surface contact points.

FIG. 1 shows an apparatus 100 for testing a substrate, particularly a packaging substrate 10, described above according to embodiments described herein in a schematic sectional view. The apparatus 100 includes a vacuum chamber 110 that may be a testing chamber specifically configured for testing or that may be one vacuum chamber of a larger vacuum system, e.g. a processing chamber of a substrate, particularly a packaging substrate, manufacturing or processing system.

As it is schematically depicted in FIG. 1, a substrate, particularly a packaging substrate, 10 includes a first device-to-device electrical interconnect path 20 extending between a first surface contact point 21 and a second surface contact point 22 of the packaging substrate 10. Optionally, the first device-to-device electrical interconnect path 20 may extend between three or more surface contact points that may be provided on the same surface or on two opposite surfaces of the packaging substrate. The device-to-device electrical interconnect path 20 depicted in FIG. 1 extends only between the first surface contact point 21 and the second surface contact point 22 that are both arranged at a top surface of the packaging substrate, but the present disclosure is not limited to such device-to-device electrical interconnect paths, and the device-to-device electrical interconnect path may be a complex network of vias, pillars, and/or conductor lines extending through the packaging substrate and having a plurality of surface contact points.

The packaging substrate 10 may include a plurality of device-to-device electrical interconnect paths 20 for connecting a plurality of devices that are to be placed on the packaging substrate 10. In FIG. 1, three device-to-device electrical interconnect paths are exemplarily depicted, but the packaging substrate 10 may include thousands or tens of thousands of such device-to-device electrical interconnect paths that are typically electrically isolated from each other, if no short exists between two electrical interconnect paths.

According to embodiments described herein, the packaging substrate 10 is placed on a stage 105 in the vacuum chamber 110. The stage can be movable, particularly in the z-direction (i.e., in a direction perpendicular to the stage surface) and/or in the x- and y-directions (i.e., in the plane of the stage surface). The stage 105 is provided within the vacuum chamber and is configured to support the packaging substrate being one of a panel level packaging substrate and an advanced packaging substrate. An electron beam 111 is directed on the first surface contact point 21. The electron beam can be scanned to be directed to the second surface contact point 22. Signal electrons 113 emitted from the second surface contact point 22 are detected for testing the first device-to-device electrical interconnect path 20. The signal electrons may be secondary electrons and/or backscattered electrons. For example, it can be determined whether the first device-to-device electrical interconnect path 20 has an "open"-defect.

Alternatively or additionally, the electron beam 111 is directed on a further surface contact point 27 that is not an end point of the first device-to-device electrical interconnect path 20, i.e. that belongs to a second device-to-device electrical interconnect path 23 that may extend through the packaging substrate adjacent to the first device-to-device electrical interconnect path 20. Signal electrons emitted from the further surface contact point 27 are detected for testing the first device-to-device electrical interconnect path 20. The signal electrons may be secondary electrons and/or backscattered electrons. For example, it can be determined whether the first device-to-device electrical interconnect path 20 has a "short"-defect.

In particular, by detecting the signal electrons 113 emitted upon impingement of the electron beam 111 on the packaging substrate (particularly, by determining the energy of the signal electrons 113 that depends on the electric potential of the second surface contact point 22 or of the further surface contact point 27), it can be determined in a "voltage contrast measurement", if the first device-to-device electrical interconnect path 20 is defective. Specifically, defective connections in the packaging substrate can be determined and classified, e.g. in open, short and/or leakage defects.

In some embodiments, which can be combined with other embodiments described herein, one or more electrical connections extending between surface contacts on different sides of the substrate are inspected. In yet further embodiments, a first plurality of electrical connections extending between surface contacts on a first side of the substrate, a second plurality of electrical connections extending between surface contacts on a second side of the substrate, and/or a third plurality of electrical connections extending between surface contacts on different sides of the substrate are inspected. For example, one or more electron beam columns may be arranged on both sides of the substrates (not shown in the figures), such that surface contacts on both sides of the substrate can be charged and/or discharged for inspecting and testing the respective electrical connections.

According to embodiments described herein, both the charging and the probing is provided with an electron beam, particularly a scanning electron beam. Other testing methods like electrical and/or mechanical probing cannot provide the throughput provided by the methods and systems described herein. The methods and system described herein rely on the contactless charging and probing with electron beams. Further, the contact reliability of an electrical and/or mechanical tester decreases with the decreasing size and the increasing density and number of surface contact points that are to be tested in advanced packaging substrates. For example, contact pad sizes of 30 μm or less are difficult for mechanical probing. Further, the topography of the packaging substrates and of the surface contact points of packaging substrates may pose a problem for other test methods, such as for capacitive detectors or electrical field detectors. It is further advantageous to have a charging electron beam, e.g. as compared to a flood gun electron charging. In light of the complexity of the packing substrates, the capability of local charging as compared to charging an entire area with a flood gun improves the test procedures that are available. Further, local charging reduces the overall charge accumulated on the packing substrate. Yet further, different charging in different areas may result in a reduced overall charge provided on the substrate. For example, the overall charge can be kept close to neutral if one area is charged positive and another area is charged negative. According to some embodiments, which can be combined with other embodiments described herein, a pattern of different charges can be provided on portions of the packaging substrate.

The testing method described herein is suitable for testing packaging substrates for multi-device in-package integration, particularly for testing panel-level-packaging substrates (PLP substrates) or advanced packaging substrates (AP substrates), and uses an e-beam both for charging the device-to-device electrical interconnect path 20 and for reading the charged circuitry voltage, particularly by probing the second surface contact point and/or further surface contact points. In other words, both the "electrical driving" and the "probing" is done with an electron beam, such that defects can be reliably and quickly found. Testing by e-beam charging and e-beam probing (e.g., with an EBT column or an EBR column) is independent of topography, fast, and flexible in regards of contact point positions, size and geometry, whereas the topography of the packaging substrate may be a problem for other test methods like capacitive or electrical field detectors.

A packing substrate, such as a PLP substrate, may include a plurality of device-to-device connections, e.g. 5.000 or more, 10.000 or more, 20.000 or more, or even 50.000 or more. The connections may include Through Silicon Vias (TSVs), e.g., provided in a silicon interposer, other conductor lines extending through the packaging substrate, and/or may include multi-die interconnect bridges that may be embedded in the packaging substrate. The packaging substrate may be a multi-layer substrate including electrical interconnections in a plurality of layers arranged on top of each other, e.g. in a layer stack.

In some embodiments, the packaging substrate 10 includes a plurality of device-to-device electrical interconnect paths extending between respective first and second surface contact points, and optional further contact points, and the method may include testing the plurality of device-to-device electrical interconnect paths sequentially or in parallel. "Sequential testing" as used herein refers to the subsequent testing of a plurality of device-to-device electrical interconnect paths of the packaging substrate. For example, 5.000 or more device-to-device electrical interconnect paths are tested one after the other. "Parallel testing" as used herein may refer to the synchronous testing of two or more device-to-device electrical interconnect paths. "Parallel testing" as used herein may also refer to the testing of several device-to-device electrical interconnect paths by scanning the electron beam for charging within one field of view over several first surface contact points while scanning the electron beam for probing in one field of view over several corresponding second surface contact points.

While conventional PCBs typically include comparatively large flat metal pads that form surface contact points for testing, a substrate, particularly a packaging substrate, that is tested according to embodiments described herein may include huge numbers of small, convexly shaped solder bumps to be tested which makes testing more challenging. In particular, the first surface contact point 21 and the second surface contact point 22 may have a maximum dimension of 25 μm or less, particularly 10 μm or less, respectively. For example, the first and second surface contact points may be essentially round, particularly semi-spherically shaped, with a diameter of 25 μm or less, particularly 10 μm or less. According to some embodiments, which can be combined with other embodiments described herein, a surface contact point can have a three-dimensional topography, particularly a substantially semi-spherical shape.

In contrast to mechanical testers, electron beams can be accurately directed on such small surface areas because electron beams can be focused down to very small probe diameters and can be accurately directed on predetermined points of the substrate, e.g. with scan deflectors, e.g. with an accuracy in a sub-μm-range. While other testers may slip or slide from surface contact points with a convex geometry, electron beams can be accurately focused onto arbitrary geometries.

As it is schematically depicted in FIG. 1, the charged particle beam column 120 may be provided on a first side of the stage 105. In some embodiments, which can be combined with other embodiments described herein, the charged particle beam column 120 may have an electron source 121 for generating an electron beam as well as beam-optical elements, such as a scan deflector 122 and/or an objective lens 124, for directing the first electron beam onto a substrate placed on the stage 105. The objective lens 124 may be an electrostatic objective lens (as shown in FIG. 1), a magnetic objective lens, or a magnetic-electrostatic objective lens.

The apparatus 100 further includes an electron detector 140 for detecting signal electrons 113 emitted upon impingement of the second electron beam on the packaging substrate, and an analysis unit 141 configured to determine, based on the signal electrons 113, if the first device-to-device electrical interconnect path 20 is defective. In some embodiments, the analysis unit 141 may be configured to determine, based on the detected signal electrons, whether an electrical interconnect path has a defect, such as a short, an open and/or a leakage. Optionally, the analysis unit 141 may be configured to classify any detected defect. In some embodiments, the analysis unit 141 may be configured to determine, based on the detected signal electrons from subsequent measurements, whether a short or a leakage exists between two or more electrical interconnect paths. In some implementations, the signal electrons 113 detected by the electron detector 140 may provide information about an electric potential of the substrate location from which the signal electrons 113 are emitted or reflected, and the analysis unit 141 may be configured to determine from said information if the first device-to-device electrical interconnect path 20 is defective or not. The analysis unit 141 may be further configured to classify a determined defect. Specifically, testing may include determining, by the analysis unit 141, if the first device-to-device electrical interconnect path 20 has any of a short, an open, and/or a leakage. An "open" is understood as an open electrical interconnect path that does not actually electrically connect the first surface contact point 21 and the second surface contact point 22. A "short" is understood as an electrical connection between two electrical interconnect paths that are actually to be electrically separated.

In some embodiments, which can be combined with other embodiments described herein, the electron detector 140 includes an Everhard-Thornley detector. An energy filter 142 for the signal electrons 113 may be arranged in front of the electron detector 140, particularly in front of the Everhard-Thornley detector, as it is schematically depicted in FIG. 1. The energy filter may include a grid electrode configured to be set on a predetermined potential. The energy filter 142 may allow the suppression of low-energy signal electrons. The energy filter 142 may suppress signal electrons that are irrelevant for the voltage contrast measurements to be conducted. In some implementations, the energy filter 142 may suppress signal electrons emitted from uncharged surface areas and may only let through signal electrons emitted from a charged surface contact point. Accordingly, the signal current detected by the electron detector may depend on the energy of the signal electrons which indicates if a probed surface contact point is defective or not.

In some embodiments, the apparatus 100 may include a scan controller 123 connected to a scan deflector 122 of the charged particle beam column 120. The scan deflector 122 may be configured to scan the electron beam over a substrate surface. The electron beam may be directed on a portion of the packaging substrate, e.g. with a first beam probe diameter. The portion of the packaging substrate can be an area of the packaging substrate, wherein the electron beam is scanned over the area of the packaging substrate. The electron beam can be raster scanned over the portion of the packaging substrate. For example, one or more scan deflectors 122 can scan the electron-beam over the portion of the packaging substrate. The portion of the packaging substrate may also be a surface contact point. The electron-beam can be vector scanned to one or more surface contact points of the packaging substrate. For example, one or more scan deflectors can be used to vector scan the electron-beam to one or more surface contact points.

For example, the scan controller 123 may be configured to control the scan deflectors such that the electron beam is sequentially directed to pairs of first and second surface contact points for testing respective device-to-device electrical interconnect paths extending between the respective pairs of first and second surface contact points. This allows a quick and reliable test of a plurality of electrical interconnect paths extending through the packaging substrate.

According to some embodiments, which can be combined with other embodiments described herein, the electron beam can be vector scanned to individual positions, for example surface contact points of the packaging substrate, for charging and can be vector scanned to individual positions for detecting signal electrons. Alternatively, the electron beam can be vector scanned to individual positions, for example surface contact points of the packaging substrate, for charging and can be raster scanned on an area of the packaging substrate for detecting signal electrons. According to some embodiments, which can be combined with other embodiments described herein, an electron-beam of the charged particle beam column can be scanned to one or more positions on the packaging substrate for charging and for detecting of signal electrons.

As it is schematically depicted in FIG. 1, the electron source 121 is connected to a power supply 130. The power supply can provide a high-voltage to the electron source for emitting the electron beam, i.e. the primary electron beam, from the electron source. According to some embodiments, which can be combined with other embodiments described herein, the voltage provided by the power supply 130 can be varied to change the energy of the electron beam and, thus, the landing energy $U_{pe}$ of the electron beam on the packaging substrate. Typically, for conducting methods of testing a substrate, particularly a packaging substrate, initially an appropriate working point is selected. The working point includes operating parameters such as the landing energy $U_{pe}$, working distance between probe and packaging substrate, probe size, electron beam current, etc.

According to some embodiments, which can be combined with other embodiments described herein, one or more power supplies can be connected to various components of the electron beam column. For example, power supplies can be connected to the electron source (as shown in FIG. 1), to an extractor of the electron source, to an anode of the electron source, to a deceleration electrode configured to decelerate the electrons before impingement on the packaging substrate, and/or to the stage 105. The landing energy of the electron beam on the packaging substrate is determined by the potential difference between the potential of the emitter tip of the electron source and the potential of the packaging substrate or the potential of the stage 105, respectively. Accordingly, one or more power supplies to vary the landing energy of the electron beam can be provided.

With exemplary reference to FIG. 1, according to embodiments which can be combined with other embodiments described herein, apparatus 100 includes a controller 180 configured to control the scan deflector 122 and the objective lens 124. Accordingly, the controller 180 can be connected to the scan deflector 122 and the objective lens 124, e.g. by a physical connection or a wireless connection. In particular, the controller is configured to control the scan deflector 122 and the objective lens 124 for: a) directing the electron beam with a first beam diameter and a first impact angle $\theta_1$ on one or more first surface contact points on the packaging substrate, and b) directing the electron beam (111) with at least one of a second beam diameter and a second impact angle $\theta_2$ on one or more second surface contact points different from the one or more first surface contact points, wherein at least one of the following applies: i) the first impact angle $\theta_1$ is different from the second impact angle $\theta_2$, and ii) the second beam diameter is different from the first beam diameter.

Further, according to some embodiments, which can be combined with other embodiments described herein, the controller can be connected to the power supply 130, the scan controller 123, the analysis unit 141, and the stage 105. The controller may also be connected to the detector 140. Further, the controller can be connected to the objective lens 124, e.g. for controlling and/or adjusting the focus of the objective lens.

The controller 180 comprises a central processing unit (CPU), a memory and, for example, support circuits. To facilitate control of the apparatus for testing packaging substrates, the CPU may be one of any form of general purpose computer processor that can be used in an industrial setting for controlling various chambers and sub-processors. The memory is coupled to the CPU. The memory, or a computer readable medium, may be one or more readily available memory devices such as random access memory, read only memory, hard disk, or any other form of digital storage either local or remote. The support circuits may be coupled to the CPU for supporting the processor in a conventional manner. These circuits include cache, power supplies, clock circuits, input/output circuitry and related subsystems, and the like. Inspecting process instructions are generally stored in the memory as a software routine typically known as a recipe. The software routine may also be stored and/or executed by a second CPU (not shown) that is remotely located from the hardware being controlled by the CPU. The software routine, when executed by CPU, transforms the general purpose computer into a specific purpose computer (controller) that controls the apparatus operation such as that for controlling the landing energy, the stage positioning and charged particle beam scanning during the testing operation. Although the method and/or process of the present disclosure is discussed as being implemented as a software routine, some of the method steps that are disclosed therein may be performed in hardware as well as by the software controller. As such, embodiments of the invention may be implemented in software as executed upon a computer system, and hardware as an application specific integrated circuit or other type of hardware implementation, or a combination of software and hardware.

According to an embodiment, and apparatus for testing of packaging substrates with any of the methods described herein is provided. The apparatus may include the controller 180. The controller may execute or perform a method of testing a substrate, particularly a packaging substrate, according to any embodiments described herein. The controller includes a processor and a memory storing instructions that, when executed by the processor, cause the apparatus to perform a method according embodiments of the present disclosure.

Figure 2A:
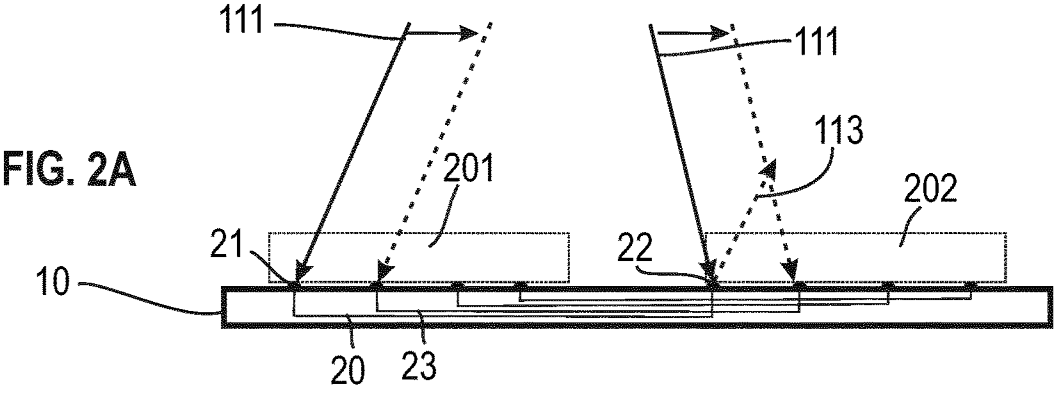
FIGS. 2A and 2B show enlarged sectional views of packaging substrates during any of the testing methods described herein.
Figure 2B:
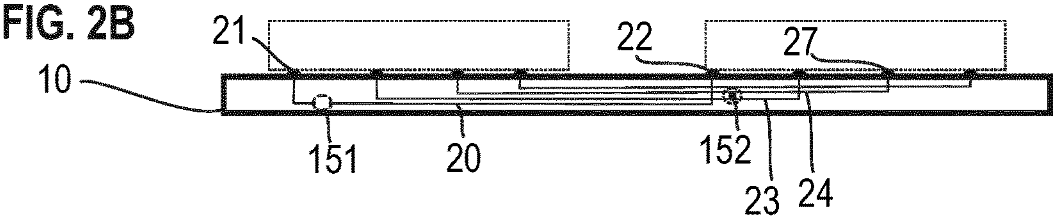

FIGS. 2A and 2B show enlarged sectional views of packaging substrates during a testing method described herein. The packaging substrate 10 may be an AP substrate or a PLP-substrate for the manufacture of a multi-die integrated package and includes a first die connection interface for attaching a first die 201 and a second die connection interface for attaching a second die 202. A plurality of device-to-device electrical interconnect paths (four of which are exemplarily shown in FIG. 2A and FIG. 2B) extend between a respective first surface contact point of the first die connection interface and a respective second surface contact point of the second die interconnection interface. The surface contact points may be formed as or include solder bumps that have a three-dimensional geometry, e.g., an essentially semi-spherical shape.

In FIG. 2A, a first device-to-device electrical interconnect path 20 extending between a first surface contact point 21 and a second surface contact point 22 is tested by directing a charging electron beam 111 on the first surface contact point 21 and directing the electron beam on the second surface contact point 22. Since the first surface contact point 21 is electrically connected to the second surface contact point 22 by the first device-to-device electrical interconnect path 20, the second surface contact point 22 should be at the same electrical potential as the first surface contact point 21 after charging of the first surface contact point 21. Signal electrons 113 emitted from the second surface contact point 22 are detected that carry information about the electrical potential of the second surface contact point 22 which should be equal to the electrical potential of the first surface contact point 21. If an electrical potential of the second surface contact point 22 different from the electrical potential of the first surface contact point 21 is determined, a defect is detected. The detected voltage contrast can be used for characterizing the defect. Further, the detected voltage contrasts of subsequent measurements of neighboring electrical interconnect paths can be compared, in order to find out about shorts or leakages between different electrical interconnect paths.

After the test of the first device-to-device electrical interconnect path 20, the electron beam 111 can be directed on two surface contact points of a second device-to-device electrical interconnect path 23, e.g. by scanning (vector scanning) the electron beams with respective scan deflectors to other positions and/or by moving the stage on which the packaging substrate is supported. A plurality of device-to-device electrical interconnect paths can be subsequently tested with the charging electron beam and the probing electron beam. Accordingly, a plurality of test points can be tested sequentially and/or in parallel.

In FIG. 2B, an open 151 exists in the first device-to-device electrical interconnect path 20. The open 151 is determined because the second surface contact point 22 is not charged after or during the charging of the first surface contact point 21 by the charging electron beam 111.

In FIG. 2B, a short 152 exists between the second device-to-device electrical interconnect path 23 and a third device-to-device electrical interconnect path 24. The short can be determined because the third device-to-device electrical interconnect path 24 is charged together with the second device-to-device electrical interconnect path 23, which can be detected by the probing electron beam that is directed on the further surface contact point 27 of the third device-to-device electrical interconnect path 24 after or during the charging of the second device-to-device electrical interconnect path 23.

For an evaluation and defect classification, the signals of measurements of neighboring interconnect paths and/or previously collected data can be compared, such that opens, shorts, and leakages in the packaging substrate can be identified.

Figure 3:
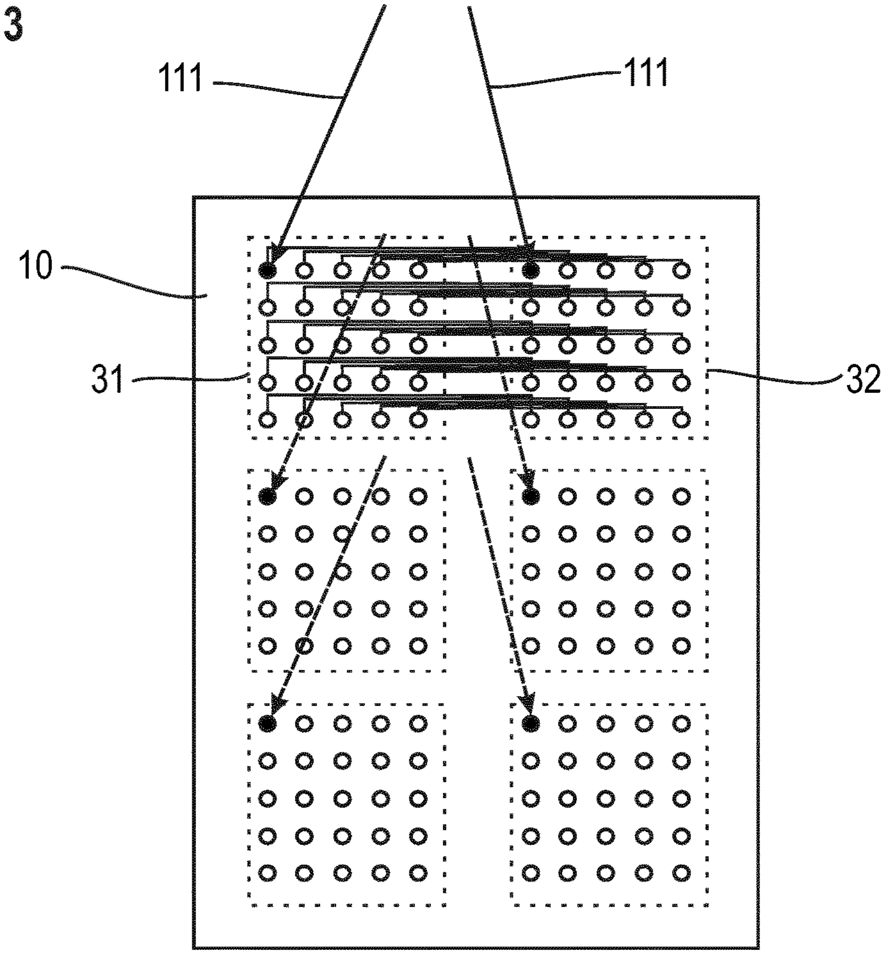
FIG. 3 shows an enlarged top view of a substrate, particularly a packaging substrate, during any of the testing methods described herein.

FIG. 3 is a schematic top view of a substrate, particularly a packaging substrate, 10 as described herein under test. The packaging substrate has a top surface with a plurality of surface contact points arranged in a 2-dimensional pattern. The packaging substrate 10 includes a first die connection interface 31 for attaching a first die, particularly by flip-chip mounting, a second die connection interface 32 for attaching a second die, particularly by flip-chip mounting, and optional further die connection interfaces that may be arranged pairwise next to each other. The first die connection interface 31 may include a plurality of first surface contact points, e.g., formed as solder bumps, and the second die connection interface 32 may include a plurality of second surface contact points, e.g., formed as solder bumps.

In some embodiments, each first surface contact point of the first die connection interface 31 is connected to one respective second surface contact point of the second die connection interface 32 by a device-to-device electrical interconnect path. For the sake of clarity, only the device-to-device electrical interconnect paths connecting the first and second die connection interfaces are depicted. According to some embodiments, which can be combined with other embodiments described herein, the first surface contact point may be connected to one second surface contact point. Alternatively, the first surface contact point may be connected to two or more second surface contact points. The two or more second surface contact points can be probed with the electron beam, for example, after charge has been applied to the first surface contact point.

According to the testing method described herein, the charging electron beam 111 is directed, particularly focused, on a first surface contact point of the first die connection interface 31, and the charging electron beam 111 is directed, particularly focused, on the associated second surface contact point of the second die connection interface 32. Signal electrons emitted from the second surface contact point are detected for testing whether an "open"-defect exists in the electrical interconnect path that connects the first and second surface contact points. Thereafter, the other surface contact points of the first and second die connection interfaces may be tested, particularly pairwise.

Alternatively or additionally, it can be tested in parallel or subsequently, whether the charging of one device-to-device electrical interconnect path leads to the charging of a surface contact point of another device-to-device electrical interconnect path, such that a "short"-defect can be determined. For example, the electron beam can be raster scanned over a portion of the packaging substrate to generate an image of the portion of the packaging substrate. The image can be evaluated, for example, by pattern recognition.

FIGS. 4A to 4D show enlarged sectional views of packaging substrates that can be tested according to the methods described herein.

Figure 4A:
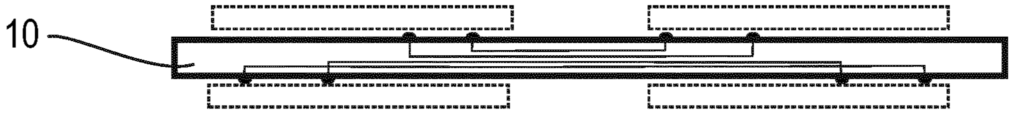
FIGS. 4A-4D show enlarged sectional views of packaging substrates that can be tested according to the methods described herein.

The packaging substrate 10 depicted in FIG. 4A has surface contact points on both main surfaces of the packaging substrate. For example, a first plurality of device-to-device electrical interconnect paths may extend between first and second surface contact points exposed on an upper substrate surface, and a second plurality of device-to-device electrical interconnect paths may extend between first and second surface contact points exposed on a lower substrate surface.

Figure 4B:
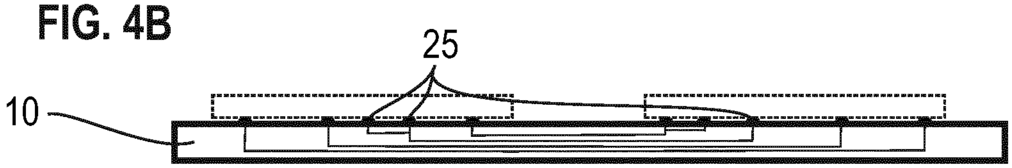

The packaging substrate 10 depicted in FIG. 4B has at least one device-to-device electrical interconnect path that extends between at least three surface contact points 25, i.e. a first surface contact point, a second surface contact point, and at least a third surface contact point.

Figure 4C:
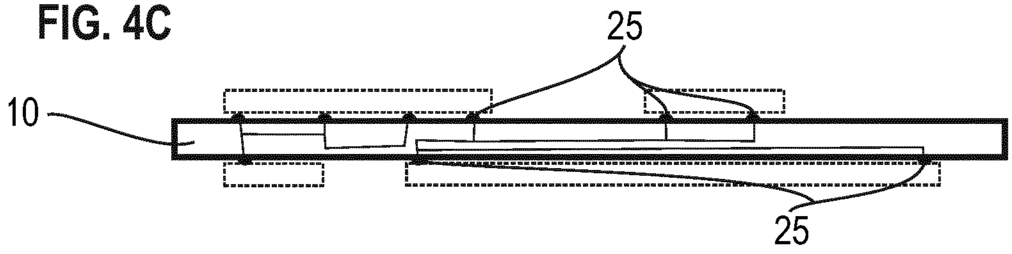

The packaging substrate 10 depicted in FIG. 4C has at least one device-to-device electrical interconnect path that extends between at least three surface contact points 25 that are exposed on different main surfaces of the substrate in a complex connection network. Such a device-to-device electrical interconnect path may be configured for connecting three or more dies with each other through the packaging substrate.

Figure 4D:
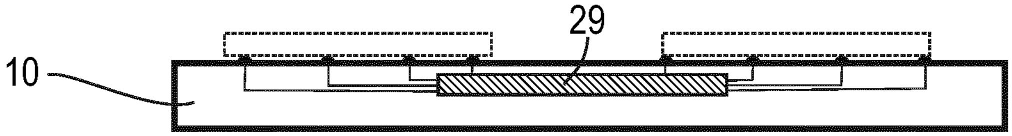

The packaging substrate 10 depicted in FIG. 4D has at least one interconnect bridge 29 embedded in the packaging substrate 10. At least one device-to-device electrical interconnect path extends through the at least one interconnect bridge 29. In particular, a plurality of device-to-device electrical interconnect paths extending between a first die connection interface and a second die connection interface of the packaging substrate extend through the interconnect bridge. The interconnect bridge may be embedded in the packaging substrate during the manufacture of the packaging substrate. The interconnect bridge may be a bridge chip embedded in the packaging substrate for increasing the connection speed between multiple dies.

According to some embodiments, which can be combined with other embodiments described herein, test methods and/or apparatuses according to the present disclosure may be utilized during and/or after manufacturing of a substrate, particularly a packaging substrate. For example, a test may be applied on a substrate, particularly a packaging substrate that does not yet include all layers or structures. For example, a test may be conducted after a redistribution layer (RDL) has been manufactured and/or after a via layer has been manufactured. An RDL test and/or a via test can be provided. Yet further, a test may be provided on the finished packaging substrate.

Figure 5:
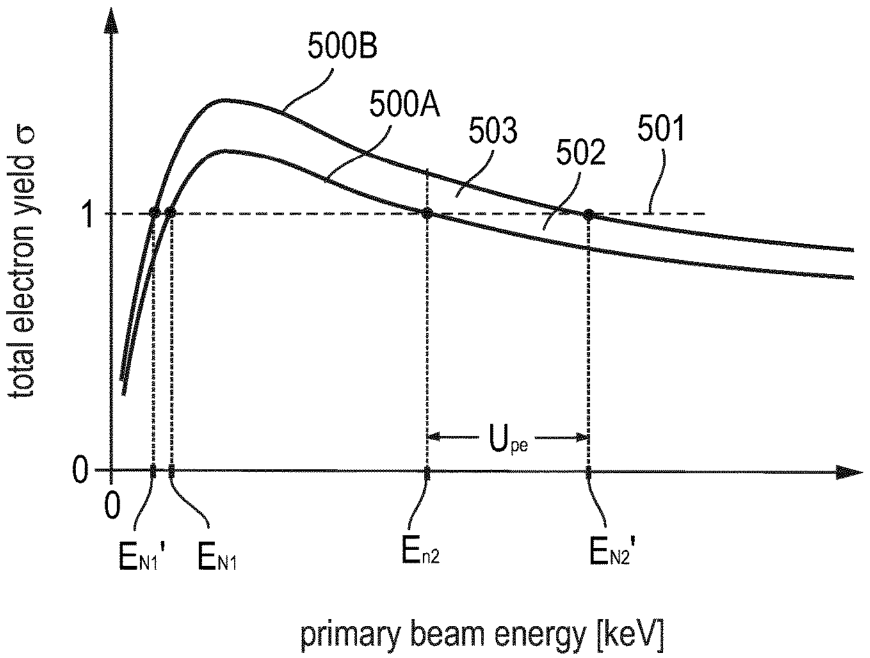
FIG. 5 shows a graph illustrating the total electron yield and sample charging, respectively, as a function of the primary beam energy, e.g. the landing energy of the electron beam on the packaging substrate, for different impact angles $\theta$.

FIG. 5 shows two graphs 500A and 500B illustrating the total electron yield as a function of the primary beam energy, i.e. the landing energy of the electron beam on the packaging substrate. Graph 500A shows the total electron yield as a function of the primary beam energy for the case that the impact angle θ is θ=0°. Graph 500B shows the total electron yield as a function of the primary beam energy for the case that the impact angle θ is θ>0°, for example θ=90°. As can be seen from FIG. 5, the number of electrons emitted from the surface of the packaging substrate per irradiated electron, i.e. the total electron yield is energy dependent. Line 501 corresponds to a total electron yield of 1. Accordingly, the same number of electrons reach the surface of the packaging substrate as compared to the number of signal electrons being emitted from or scattered at the surface of the packaging substrate. For each of the graphs 500A and 500B, there are two neutral energy values. For graph 500A there is a first neutral energy value $E_{N1}$ and a second neutral energy value $E_{N2}$, for which the total electron yield equals 1, i.e. there is no charging. Accordingly, for graph 500B there is a first neutral energy value $E_{N1}'$ and a second neutral energy value $E_{N2}'$, for which the total electron yield equals 1, i.e. there is no charging. If the total electron yield σ is σ>1, positive charging occurs. The total electron yield being larger than 1 relates to the fact that more electrons leave the surface as compared to the number of electrons impinging on the surface. Thus, the packaging substrate or structures charge positively. If the total electron yield σ is σ<1, negative charging occurs. The total electron yield being smaller than 1 relates to the fact that less electrons leave the surface as compared to the number of electrons impinging on the surface. Thus, the packaging substrates or structures charge negatively.

Further, according to some embodiments, which can be combined with other embodiments described herein, the surface of the packaging substrate can be read, i.e. signal electrons can be detected, with an electron beam having one of the neutral energy values.

According to some embodiments, which can be combined with other embodiments described herein, directing an electron beam with a landing energy $U_{pe}$, a first beam diameter $BD_1$ and a first impact angle $\theta_1$ on one or more first surface contact points on the packaging substrate can be a charging operation. The charging operation "writes" a charge to an electrical interconnect path or a network of electrical interconnect paths. Further, directing the electron beam with at least one of a second beam diameter $BD_2$ and a second impact angle $\theta_2$ on one or more second surface contact points different from the one or more first surface contact points can be an operation for detecting signal electrons. The electron beam at the second landing energy may "read" a charge of an electrical interconnect path or a network of electrical interconnect paths.

According to some embodiments, which can be combined with other embodiments described herein, charging of portions of the packaging substrate is reduced or avoided during detection of signal electrons, i.e. reading of a charge. Particularly, influencing of a charge of electrical interconnect paths or networks of electrical interconnect paths is avoided or kept to a minimum while detecting signal electrons, for example, detecting the charge previously provided.

For example, a network of electrical interconnect paths may include 5 surface contact points (or any number larger than 2). A charge can be applied, i.e. "written", to a first surface contact point. The charge applied to the network of electrical interconnect paths can be "read" at a second surface contact point. It is beneficial not to change the charge of the network of electrical interconnect paths having the 5 surface contact points while "reading" the charge on the second to fifth surface contact point. Accordingly, charge generation can be reduced or avoided while detecting signal electrons by utilizing a neutral energy value for the landing energy.

The neutral energy values are material dependent. The material of the packaging substrate or a material of the surface of the packaging substrate is known and the landing energies can be adapted to the packaging substrate material for methods of testing the packaging substrate. The first neutral energy value, e.g. $E_{N1}$ for graph 500A and/or $E_{N1}'$ for graph 500B, can be a few hundred eV. The second neutral energy value, e.g. $E_{N2}$ for graph 500A and/or $E_{N2}'$ for graph 500B, can be between 2 keV and 5 keV for typical packaging substrates or typical surface contact points on a substrate, particularly a packaging substrate. In particular, the second neutral energy value $E_{N2}$ for graph 500A can be between 2 keV and 3 keV. The second neutral energy value $E_{N2}'$ for graph 500B can be between 3.5 keV and 5 keV.

According to some embodiments, which can be combined with other embodiments described herein, the landing energy $U_{pe}$ for the test methods can be chosen to be $E_{N2}<U_{pe}<E_{N2}'$, as exemplarily indicated in FIGS. Alternatively, the landing energy $U_{pe}$ for the test methods can be chosen to be $E_{N1}'<U_{pe}<E_{N1}$. The landing energy can be adapted depending on the test strategy, the material of the packaging substrate, and/or the material of the surface contact points.

According to embodiments of the present disclosure, test structures, for example, regions of a substrate, particularly a packaging substrate, particularly surface contact points can be charged positive or negative by the electron beam impact. In particular, the total electron yield can be controlled depending on the impact angle θ of the electron beam on the surface contact point.

Figures 6A, 6B, 6C:
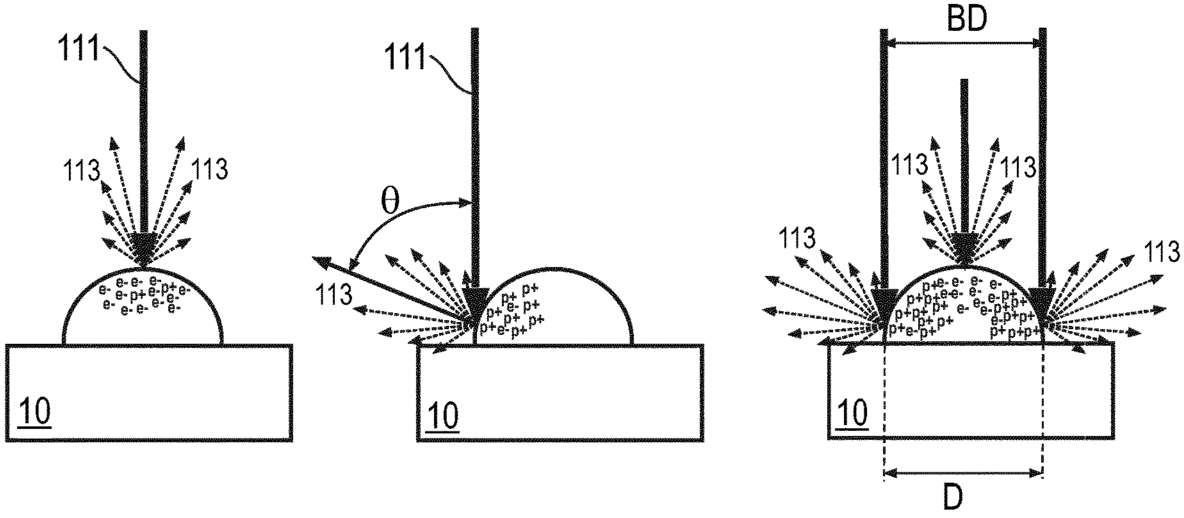
FIG. 6A shows an electron beam directed on a surface contact point with an impact angle $\theta$ of $\theta=0°$ resulting in a negative charging.
FIG. 6B shows an electron beam directed on a surface contact point with an impact angle $\theta$ of $\theta>0°$, particularly $80°\leq\theta\leq90°$, resulting in a positive charging.
FIG. 6C shows an example of an electron beam directed on a surface contact point with a beam diameter substantially corresponding to the diameter of the surface contact point resulting in a positive charging.

With exemplary reference to FIGS. 6A to 6C, the charging effect employed in the embodiments described herein is described. FIGS. 6A to 6C show schematic side views of an exemplary surface contact point onto which an electron beam 111 is directed, causing an emission of signal electrons 113.

FIG. 6A shows an example of an electron beam 111 directed on a surface contact point with a landing energy $U_{pe}$ being $E_{N2}<U_{pe}<E_{N2}'$ and an impact angle θ of θ=0°. Accordingly, as shown by region 502 in FIG. 5, the total electron yield is smaller than 1, such that negative charging occurs.

FIG. 6B shows an example of an electron beam 111 directed on a surface contact point with a landing energy $U_{pe}$ being $E_{N2}<U_{pe}<E_{N2}'$ and an impact angle θ of θ>0°, particularly 80°≤θ≤900. Accordingly, as shown by region 503 in FIG. 5, the total electron yield is larger than 1, such that positive charging occurs.

According to some embodiments, which can be combined with other embodiments described herein, the total electron yield can be controlled depending on the beam diameter BD of the electron beam directed on the surface of the contact point. FIG. 6C shows an example of an electron beam 111 directed on a surface contact point with landing energy $U_{pe}$ being $E_{N2}<U_{pe}<E_{N2}'$ and a beam diameter BD substantially corresponding to the diameter D of the surface contact point.

As exemplarily shown in FIG. 6C, in total there are more electrons leaving the substrate than are introduced by the primary electron beam, resulting in a total electron yield larger than 1, such that positive charging occurs.

It is to be understood that, depending on the primary energy level, i.e. the landing energy in relation to the secondary electron yield, the total electron yield can be controlled. The test point potential can be determined. A voltage contrast principle can be utilized for defect detection. According to some embodiments, which can be combined with other embodiments described herein, the landing energy can be set to a required landing energy and positioned on one or more surface contact points as described herein or a test point on the packaging substrate. The electron-beam remains on the respective surface contact point of the packaging substrate for a defined time to charge the portion of the packaging substrate positive or negative with respect to the environment of the portion of the packaging substrate. For example, the environment of a surface contact point under test can be one or more neighboring surface contact points.

According to some embodiments, which can be combined with other embodiments described herein, the one or more first surface contact points and/or the one or more second surface contact points are charged positively during the first test sequence and are charged negatively during the subsequent second test sequence. Different test sequences can be applied with positive or negative charges. Further, changing from positively charging to negatively charging and vice versa reduces the overall charge accumulated on the packaging substrate. The testing accuracy can be improved by reducing the overall charge that is accumulated on the packaging substrate. For example, changing from negatively charging to positively charging can be conducted by increasing the impact angle θ as exemplarily described with reference to FIG. 6B. Additionally or alternatively, changing from negatively charging to positively charging may be conducted by increasing the beam diameter BD as exemplarily described with reference to FIG. 6C.

Figure 7A:
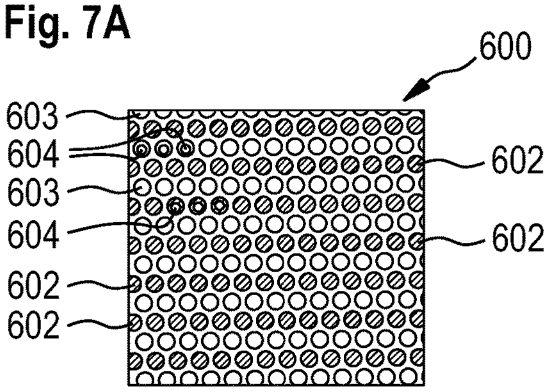
FIGS. 7A and 7B show images and illustrate portions of the substrate, particularly the packaging substrate, according to test methods described herein.
Figure 7B:
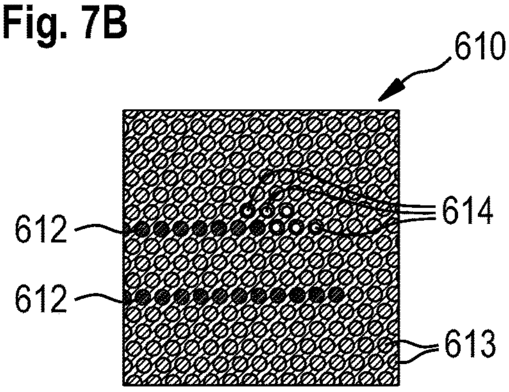

FIGS. 7A and 7B show images of a substrate, particularly a packaging substrate, for illustrating test methods according to embodiments of the present disclosure. The image 600 shown in FIG. 7A can relate to a first portion of the packaging substrate on which the electron-beam of the charged particle beam column 120 is directed. According to some embodiments, which can be combined with other embodiments described herein, the field of view of the electron-beam column and the size of field of view of the methods of testing the packaging substrate may be in a range of 25 mm to 80 mm. Accordingly, the field of view can beneficially be chosen to cover one panel on a substrate, particularly a packaging substrate, without stage movement.

The image 600 shows positively charged surface contact points 602 and surface contact points 603. The surface contact points 603 may be uncharged or may be negatively charged. The surface contact points 603 are at a negative potential relative to the surface contact point 602. Electrons emitted from a more negative area are accelerated away from the packaging substrate or experience less deceleration by a positive charge on the packaging substrate. Accordingly, electrons emitted from a more negative area have a higher energy as compared to electrons emitted from a less negative area or positive area. Further, a positive charge on an area of the packaging substrate may hinder electrons from being emitted. The overall number of electrons may be reduced in a positively charged area.

According to some embodiments, which can be combined with other embodiments described herein, the higher energy of electrons from regions of the packaging substrate, which are more negatively charged as compared to other regions of the packaging substrate, allows the higher energy electrons to pass through an energy filter (see, for example, energy filter 142 in FIG. 1). Accordingly, more electrons reach the electron detector 140. The brighter regions in FIG. 7A refer to higher energy electrons.

According to some embodiments, which can be combined with other embodiments described herein, a portion of a substrate, particularly a packaging substrate, as referred to herein may relate to an area, such as an area of the image 600 shown in FIG. 7A. The portion of a substrate, particularly a packaging substrate, typically includes the one or more first surface contact points and/or the one or more second surface contact points as described herein. The image is generated by raster scanning the electron-beam over the field of view or a portion of the field of view. The area can be scanned by the electron beam similar to the scanning of an image. According to some embodiments, which can be combined with other embodiments described herein, a portion of a substrate, particularly a packaging substrate, as referred to herein can also be one or more beam positions on a surface contact point, on which the electron beam contacts the packaging substrate. The one or more beam positions can be addressed with the electron-beam column by vector scanning to the individual beam positions. FIGS. 7A and 7B show the beam positions 604 and beam positions 614, respectively, by white circles. Exemplarily, the beam positions 604 and beam positions 614 are shown on surface contact points of the packaging substrate.

According to some embodiments, which can be combined with other embodiments described herein, charging of a portion of the packaging substrate can be provided over an area and/or at individual beam positions. Additionally or alternatively, reading, for example, testing, of a portion of the packaging substrate can be provided over an area and/or at individual beam positions.

While image 600 shows a portion or area of the packaging substrate, wherein the plurality of surface contact points is charged positive, for example, the dark lines of surface contact points 602 shown in FIG. 7A, FIG. 7B shows an image of a reading area or reading or testing surface contact points. The image 610 is darker for more positive surface contact points 612 and brighter for more negative surface contact points 613. Further, FIG. 7B illustrates the beam positions 614, which may be utilized in a vector scanning test procedure, as white circles.

The image 610 shows lines of positively charged surface contact points, which are however interrupted to the right-hand side. Accordingly, considering charging of entire lines as shown in FIG. 7, the interrupted lines of surface contact points 612 may be analyzed as a defect.

FIGS. 7A and 7B are described with respect to charging by directing the electron-beam on the first portion of the packaging substrate, particularly including the one or more first surface contact points, and by reading, i.e. detecting signal electrons, by directing the electron-beam on a second portion of the packaging substrate, particularly including the one or more second surface contact points. As can be seen from image 600, signal electrons are generated during charging of a portion, for example, an area of a field of view or surface contact points within the field of view, of the packaging substrate. Accordingly, detecting signal electrons for testing at least a first device-to-device electrical interconnection path can be provided while charging a portion of the packaging substrate and/or while reading the charge guided to another end of the device-to-device electrical interconnection path in a second region of the packaging substrate.

Figure 8A:
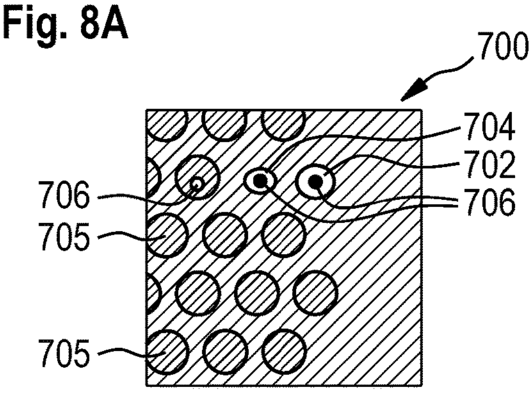
FIGS. 8A and 8B show images and illustrate portions of the substrate, particularly the packaging substrate, according to test methods described herein.
Figure 8B:
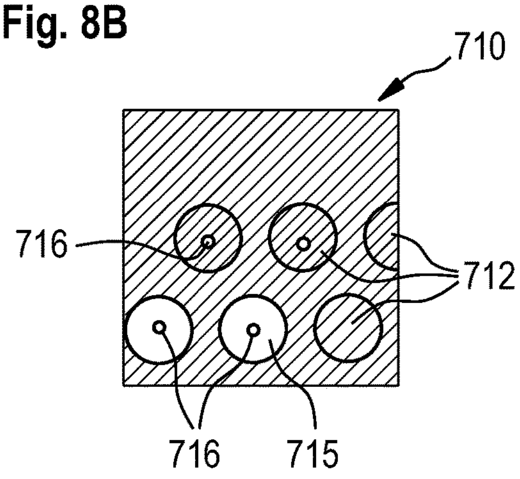

For example, FIGS. 8A and 8B show an image 700 of a portion of a substrate, particularly a packaging substrate, during charging, wherein signal electrons are detected, and an image 710 in a non-charged area of the packaging substrate, wherein signal electrons are detected. In the example shown in FIG. 8A, the first surface contact point 702 is negatively charged with the electron-beam. As a result, a second surface contact point 704 also shows a negative charge, while other surface contact points 705 are not negatively charged. Even though one contact or surface contact point is charged, two neighboring contacts or neighboring surface contact points show the charge provided on one of the contacts. The design of the packaging substrate may either include redundant connections or a defect, such as a short, which might be included in the packaging substrate.

The image 710 shown in FIG. 8B shows the two contacts or surface contact points 715, which are connected to the contacts, i.e. surface contact points 702 and surface contact points 704, in FIG. 8A as a connection of a device-to-device electrical connection path. The other surface contact points 712 are at a lower potential. Even though the images 700 and 710 shown in FIGS. 8A and 8B are utilized for illustrating test methods according to embodiments described herein, the test methods may also be applied without imaging, i.e. charging and reading with the electron-beam on beam positions 706 and beam positions 716, respectively. The beam positions 706 and beam positions 716 are shown as white circles in FIGS. 8A and 8B.

Figure 11:
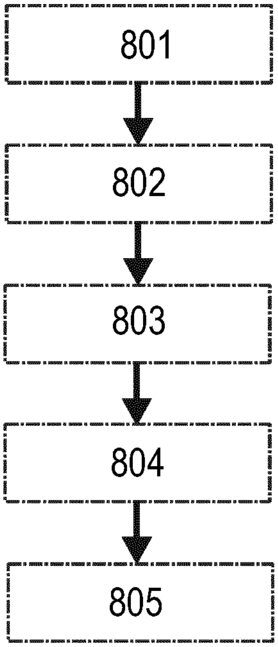
FIGS. 11 and 12 show flowcharts of methods of testing a substrate, particularly a packaging substrate, according to embodiments described herein.
Figure 12:
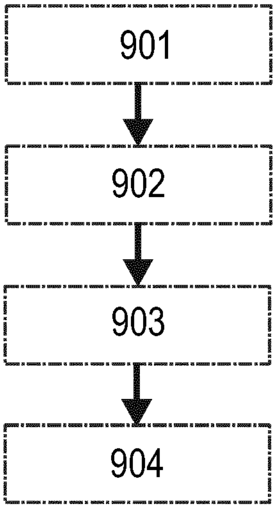

FIG. 11 shows a block diagram for illustrating methods of testing packaging substrates according to embodiments of the present disclosure. The packaging substrate is a panel of the packaging substrate or an advanced packaging substrate. The test can be conducted with at least one electron-beam from at least one electron-beam column.

At operation 801, a field of view is defined. The field of view is defined to generate a scanning electron microscope (SEM) image with the electron-beam of the electron-beam column. For example, a field of view or a high-resolution SEM image, respectively, may have a field of view with a dimension of 20 mm or more and/or 60 mm or less. For example, an SEM image may have a field of view of up to about 40 mm×40 mm. According to some embodiments, which can be combined with other embodiments described herein, a resolution of an image, e.g. an SEM image, for an initial imaging, for charging or for defect detection can have a resolution of 0.1 μm to 2 μm.

At operation 802, the electron-beam of the at least one electron-beam column with a landing energy $U_{pe}$, a first beam diameter $BD_1$ and a first impact angle $\theta_1$ is directed on one or more first surface contact points on the packaging substrate. Further, the electron beam with at least one of a second beam diameter $BD_2$ and a second impact angle $\theta_2$ is directed on one or more second surface contact points different from the one or more first surface contact points, wherein at least one of the following applies: i) the first impact angle $\theta_1$ is different from the second impact angle $\theta_2$, and ii) the second beam diameter $BD_2$ is different from the first beam diameter $BD_1$. Typically, the electron-beam is scanned over the field of view defined in operation 801. A substrate charge-up can be reduced or avoided by scanning the field of view with a landing energy close to or at the neutral energy value.

At operation 803, beam positioning and reference potentials can be determined from the image generated at operation 802. Particularly, reference potentials can be generated at charge positions, test positions, reading positions, and/or surface contact points in general. Without charge accumulation at the positions, i.e. during the imaging at operation 802, the "no defect" situation can be generated as reference. In the absence of charge accumulation, the defects in electrical interconnect path do not directly influence the resulting image.

According to some embodiments, which can be combined with other embodiments described herein, the image generated at operation 802 can be analyzed, for example, by pattern recognition. The analysis can calibrate the electron-beam position. Accordingly, surface contact points can be addressed, for example, vector scanned, with calibrated beam positions. A further distortion calibration of the electron-beam in the field of view (FOV), particularly the field of view being significantly larger as compared to an SEM image having a field of view with a size of 1 mm or below, can be avoided.

At operation 804, the electron beam is directed on one or more first surface contact points to be charged and on one or more second surface contact points different from the one or more first surface contact points to be charged. The one or more first surface contact points and/or the one or more second surface contact points can be charged positive or negative. For example, a negative charge can be provided by providing the electron beam with an impact angle θ on the respective surface contact point of $0^\circ<<45$, particularly $0^\circ\leq\theta<22.5^\circ$, more particularly $0^\circ\leq\theta<10^\circ$. For instance, the impact angle θ can be $\theta<5^\circ$. It is to be noted that a smaller impact angle provides for a more negative charge, as exemplarily described with reference to FIG. 6A.

A positive charge can be provided by providing the electron beam with an impact angle θ on the respective surface contact point of $45^\circ\leq\theta_2\leq90$, particularly $67.5^\circ\leq\theta_2\leq90$, more particularly $80^\circ\leq\theta\leq90^\circ$. For instance, the impact angle θ can be $85^\circ\leq\theta\leq90^\circ$. It is to be noted that a larger impact angle provides for a more positive charge, as exemplarily described with reference to FIG. 6B. Additionally or alternatively, a positive charge can be provided by directing the electron beam on the respective surface contact point with a beam diameter BD of $0.5\times D<BD\leq D$, particularly $0.75\times D<BD\leq D$, wherein D is the diameter of the respective surface contact point. For instance, the beam diameter BD can be $0.9\times D<BD\leq D$. It is to be noted that by increasing the beam diameter BD from $BD=0.5\times D$ to $BD=D$, the positive charge can be increased, as exemplarily described with reference to FIG. 6C.

For example, at operation 804, all test points, i.e. the selected surface contact points, of a connected net or electrical interconnect path can be charged to the same potential if there is no defect in the electrical interconnect path.

At operation 805, signal electrons are detected to test one or more electrical interconnect paths of the packaging substrate. For example, a voltage contrast image between a good reference die and the tested die can be compared. Additionally or alternatively, a voltage difference as compared to the reference image generated at operation 802 can be generated according to embodiments, which can be combined with other embodiments described herein.

Differences in the voltage contrast image indicate defects. Voltage differences at a predetermined beam positions corresponding, for example, to surface contact points can be evaluated. An image including voltage contrast information can be generated. Pattern recognition can be provided on at least portions of the image to evaluate deviations of the network of interconnect paths as compared to the desired packaging substrate. Additionally or alternatively, the voltage of surface contact points to be tested, i.e. “read” can be measured by determining the signal electrons, particularly with the detector having an energy filter. The surface contact point can be measured, for example, the voltage contrast of the surface contact point can be measured.

According to embodiments of the present disclosure, a measurement of a first surface contact point can be provided at a first beam position and a measurement of a second surface contact point can be provided at a second beam position. Vector scanning can be provided to move the electron-beam from a first beam position to a second beam position, i.e. to directly move the electron-beam from the first beam position to the second beam position. Only a few surface contact points, for example, two surface contact points, or a small number (<20) of surface contact points, corresponding to beam positions, may be required to measure one network of electrical interconnect paths.

Embodiments of the present disclosure can include generation of SEM images. The apparatuses for testing according to embodiments of the present disclosure can be configured to generate SEM images. The images can have a resolution of 3 μm or below and/or 0.1 μm or above. Beam positioning setup of beam positions on, for example, surface contact points can be based on the SEM image and may automatically be provided. No electron-beam distortion calibration is required as the positioning can be calculated based on the SEM image. The individual beam positions can be calibrated by pattern recognition, i.e. by utilizing unique features of the packaging substrate during pattern recognition, for electron-beam alignment.

Figure 9:
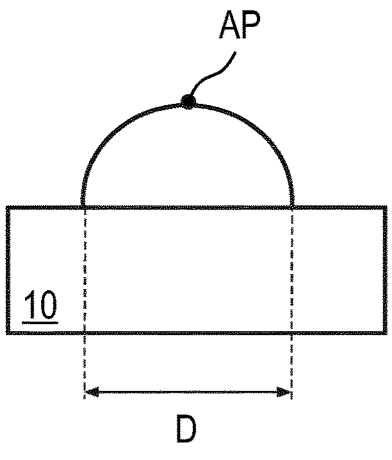
FIG. 9 shows a schematic side view of a surface contact point on a substrate, particularly a packaging substrate, according to embodiments described herein.

FIG. 9 illustrates yet further embodiments of a method of testing a substrate, particularly a packaging substrate, wherein the packaging substrate is a panel level packaging substrate or an advanced packaging substrate. According to an embodiment, the method includes placing the packaging substrate 10 on a stage 105 in a vacuum chamber 110 as indicated by operation 901. At operation 902, an electron beam 111 of the at least one electron beam column with a landing energy $U_{pe}$, a first beam diameter $BD_1$ and a first impact angle $\theta_1$ is directed on one or more first surface contact points on the packaging substrate. At operation 903, the electron beam 111 with at least one of a second beam diameter $BD_2$ and a second impact angle $\theta_2$ is directed on one or more second surface contact points. The one or more second surface contact points are different from the one or more first surface contact points. Further, at least one of the following applies: i) the first impact angle $\theta_1$ is different from the second impact angle $\theta_2$, and ii) the second beam diameter $BD_2$ is different from the first beam diameter $BD_1$. At operation 904, signal electrons 113 emitted upon impingement of the electron beam are detected for testing at least a first device-to-device electrical interconnect path 20 of the packaging substrate.

According to some embodiments, which can be combined with other embodiments described herein, the first impact angle $\theta_1$ is $0° \leq \theta_1 < 45°$. In particular, the first impact angle $\theta_1$ can be $0° \leq \theta_1 < 22.5°$. Typically, the first impact angle $\theta_1$ is $0° \leq \theta_1 < 10°$. According to an example, the first impact angle $\theta_1$ can be $0° \leq \theta_1 < 5°$.

According to some embodiments, which can be combined with other embodiments described herein, the second impact angle $\theta_2$ is $45° \leq \theta_2 \leq 90$. In particular, the second impact angle $\theta_2$ can be $67.5° \leq \theta_2 \leq 90$. Typically, the second impact angle $\theta_2$ is $80° \leq \theta_2 < 90°$. According to an example, the second impact angle $\theta_2$ can be $85° \leq \theta_2 < 90°$.

According to some embodiments, which can be combined with other embodiments described herein, the one or more first surface contact points have a first diameter $D_1$ and the first beam diameter $BD_1$ is $BD_1 \leq 0.25 \times D_1$. In particular, the first beam diameter $BD_1$ can be $BD_1 \leq 0.10 \times D_1$. For instance, the first beam diameter $BD_1$ can be $BD_1 \leq 0.05 \times D_1$.

According to some embodiments, which can be combined with other embodiments described herein, the one or more second surface contact points have a second diameter $D_2$ and the second beam diameter $BD_2$ is $0.5 \times D_2 < BD_2 \leq D_2$. In particular, the second beam diameter $BD_2$ can be $0.75 \times D_2 < BD_2 \leq D_2$. For instance, the second beam diameter $BD_2$ can be $0.9 \times D_2 < BD_2 \leq D_2$. Typically, the first diameter $D_1$ of the one or more first surface contact points corresponds to the second diameter $D_2$ of the one or more second surface contact points. In other words, the first diameter $D_1$ may be substantially identical to the second diameter $D_2$. The term “substantially identical” can be understood as identical within a tolerance T of $T \leq 10\%$, particularly $T \leq 5\%$.

According to some embodiments, which can be combined with other embodiments described herein, the electron beam 111 is directed on a first relative position of the one or more first surface contact points. Further, the electron beam 111 is directed on a second relative position of the one or more second surface contact points. The second relative position is different from the first relative position. A “relative position of a surface contact point” can be understood as a selected position referred to the particular surface contact point.

Figure 10:
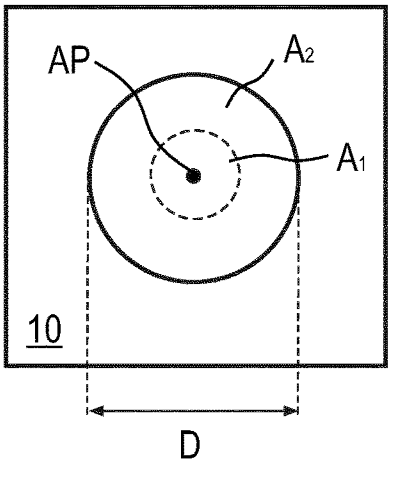
FIG. 10 shows a schematic top view of a surface contact point on a substrate, particularly a packaging substrate, according to embodiments described herein.

FIG. 9 shows a schematic side view of a surface contact point and FIG. 10 shows a schematic top view of a surface contact point. With reference to FIGS. 9 and 10, a “relative position of a surface contact point” is explained which may be applied to the first relative position of the one or more first surface contact points and the second relative position of the one or more second surface contact points described herein. As exemplarily shown in FIG. 9, a surface contact point as described herein typically has a convexly shaped topography with a diameter D and an apex AP. In particular, the apex AP can be a central apex, e.g. of a semi-spherically shaped contact point, as exemplarily shown in FIGS. 9 and 10. It is to be understood that the schematic illustration of the surface contact point with the diameter D and the apex AP shown in FIGS. 9 and 10, mutatis mutandis, can be applied to the one or more first surface contact points with a first diameter $D_1$ and a first apex $AP_1$ as well as to the one or more second surface contact points with a second diameter $D_2$ and a second apex $AP_2$, as described herein. In other words, the diameter D shown in FIGS. 9 and 10 may be replaced by the first diameter $D_1$ or the second diameter $D_2$. Accordingly, the apex AP shown in FIGS. 9 and 10 may be replaced by the first apex $AP_1$ or the second apex $AP_2$.

According to some embodiments, which can be combined with other embodiments described herein, the one or more first surface contact points have a convexly shaped topography with a first diameter $D_1$ and a first apex $AP_1$. In particular, the first apex $AP_1$ can be a central first apex. The electron beam can be directed on a first relative position of the one or more first surface contact points. Typically, the first relative position is within a first area $A_1$ around the first apex $AP_1$, wherein $A_1 \leq (D_1/4)^2 \times \pi$. The first area $A_1$ is exemplarily indicated in FIG. 10. In particular, the first relative position can be within a first area $A_1$ around the first apex $AP_1$, wherein $A_1 < (D_1/8)^2 \times \pi$. More specifically, the first relative position may be within a first area $A_1$ around the first apex $AP_1$, wherein $A_1 \leq (D_1/10)^2 \times \pi$.

According to some embodiments, which can be combined with other embodiments described herein, the one or more second surface contact points have a convexly shaped topography with a second diameter $D_2$ and a second apex $AP_2$. In particular, the second apex $AP_2$ can be a central second apex. The electron beam can be directed on a second relative position of the one or more second surface contact points. The second relative position is within a second area $A_2$ around the second apex $AP_2$, wherein $[(D_2/2)^2\times\pi-(D_2/4)^2\times\pi] \leq A_2 \leq [(D_2/2)^2\times\pi-(D_2/8)^2\times\pi]$. The second area $A_2$ is exemplarily indicated in FIG. 10. As exemplarily shown in FIG. 10, typically the second area $A_2$ is a ring-shaped area.

According to some embodiments, which can be combined with other embodiments described herein, the landing energy $U_{pe}$ of the electron beam is selected to be $E_{N2}<U_{pe}<E_{N2}'$. $E_{N2}$ is the second neutral energy value corresponding to a landing energy with a total electron yield of 1 for an impact angle $\theta=0°$. $E_{N2}'$ is the second neutral energy value corresponding to a landing energy with a total electron yield of 1 for an impact angle $\theta=90°$. Typically, the landing energy $U_{pe}$ is selected to be in the middle ±25% between $E_{N2}$ and $E_{N2}'$. In other words, the landing energy $U_{pe}$ may be $[E_{N2}+0.25\times E_{N2}]<U_{pe}<[E_{N2}'-0.25\times E_{N2}]$.

According to some embodiments, which can be combined with other embodiments described herein, the landing energy $U_{pe}$ of the electron beam is selected to be $E_{N1}'<U_{pe}<E_{N1}$. $E_{N1}$ is the first neutral energy value corresponding to a landing energy with a total electron yield of 1 for an impact angle $\theta=0°$. $E_{N1}'$ is the first neutral energy value corresponding to a landing energy with a total electron yield of 1 for an impact angle $\theta=90°$. In particular, the landing energy $U_{pe}$ may be selected to be in the middle ±25% between $E_{N1}'$ and $E_{N1}$. In other words, the landing energy $U_{pe}$ may be $[E_{N1}'+0.25\times E_{N1}']<U_{pe}<[E_{N1}-0.25\times E_{N1}]$.

According to some embodiments, which can be combined with other embodiments described herein, the method further includes scanning the electron beam to the one or more first surface contact points and the one or more second surface contact points on the packaging substrate for charging and for detecting the signal electrons. Typically, the one or more first surface contact points and the one or more second surface contact points are formed as a metal pad covered by a solder bump having a diameter of 25 μm or less, particularly 10 μm or less. As exemplarily described with reference to FIGS. 4A to 4D, the packaging substrate typically includes a plurality of device-to-device electrical interconnect paths extending between respective first surface contact points and second surface contact points. Accordingly, the method typically further includes testing the plurality of device-to-device electrical interconnect paths. The testing of the plurality of device-to-device electrical interconnect paths may be conducted sequentially and/or in parallel.

According to some embodiments, which can be combined with other embodiments described herein, the packaging substrate tested by the method as described herein includes 5.000 or more device-to-device electrical interconnect paths of which some or all are tested. In particular, the packaging substrate tested by the method as described herein may include 20.000 or more, particularly 50.000 or more, device-to-device electrical interconnect paths of which some or all are tested.

According to some embodiments, which can be combined with other embodiments described herein, the method includes obtaining information about one or more electric potentials from an energy of the signal electrons. Obtaining the information may include energy filtering the signal electrons. Further, the method typically includes determining from the information if the first device-to-device electrical interconnect path is defective. Optionally, the method may further include classifying any determined defect.

According to some embodiments, which can be combined with other embodiments described herein, the testing of the packaging substrate includes determining if the first device-to-device electrical interconnect path has one or more of the following defects: a short, an open, and/or a leakage.

The charge on portions of the packaging substrate, particularly the charge of the surface contact points as described herein, can be controlled. Additionally or alternatively, during some test sequences, charge is applied, during some test sequences no or substantially no charge is applied, and during some test sequences charge can be removed. Particularly, charge can be applied during a "writing" operation. Beneficially, no charge is applied during a "reading" operation.

According to some embodiments, which can be combined with other embodiments described herein, the individual beam positions can be addressed by vector scanning. That is the electron beam can be directed on individual positions, for example, wherein no region needs to be scanned. The capability to provide charge on individual beam positions and to read the charge at individual beam positions allows for a fast testing operation. Further, a plurality of test sequences may be generated, wherein different patterns can be "written" on individual surface contact points of the packaging substrate. A pattern may be provided, for example, in the form of a checkerboard having positions of negative charge and positions of positive charge. Accordingly, the overall charge on the packaging substrate is reduced. According to some embodiments, which can be combined with other embodiments described herein, a pattern such as a checkerboard may also be provided on regions rather than on individual locations.

According to some embodiments, which can be combined with other embodiments described herein, reading of a charge, i.e. detecting signal electrons, at the beam position for which the charge or the potential is to be determined, can be provided at the beam position of writing. For example, the charge can be applied to a first surface contact point. After a predetermined time period, it can be measured whether the charge can be detected at the first surface contact point. Additionally or alternatively, detecting signal electrons, i.e. "reading", can be provided at a different beam position, for example, at a second surface contact point that is connected to the first surface contact point, on which the charge has been applied. The electrical connection between the first surface contact point and the second surface contact point provides the charge written to the first surface contact point to the second surface contact point. Accordingly, the charge can be detected at the second surface contact point if the electrical connection is not defective. Yet further additionally or alternatively, detecting signal electrons, i.e. "reading", can be provided at further different beam positions, for example, at a third surface contact point that is not connected to the first surface contact point. As the third surface contact point is not connected to the first surface contact point, the charge should not be detectable for a non-defective packaging substrate. According to some embodiments, which can be combined with other embodiments described herein, one or more third surface contact points neighboring the second surface contact point and/or neighboring the first surface contact point can be measured.

Unless a short would be present to a neighboring surface contact point, the charge provided on the first surface contact point should not be detectable at the one or more third surface contact points.

As described above, individual beam positions may be addressed by vector scanning and test sequences may be provided by directing the electron beam on individual, i.e. distinct, beam positions only. Yet further, test sequences may include raster scanning of areas of the substrate. Accordingly, portions of the packaging substrate may also be referred to as regions which are raster scanned, wherein an image of the region is generated. Particularly, a "reading" operation can be provided based on an image raster scanned in a region of the packaging substrate.

According to some embodiments, which can be combined with other embodiments described herein, imaging a region of the packaging substrate, for example, by raster scanning, may also be provided without charge generation. For example, a reference image can be generated. Reference potentials can be determined from the reference image generated without charge generation. Additionally or alternatively, beam positioning calibration can be provided based on the reference image.

According to yet further embodiments, defect review can be provided by the methods of testing a substrate, particularly a packaging substrate, according to embodiments described herein. For example, a list of potentially defective positions may be generated by an automated optical inspection system (AOI system). A list of positions can be subject to defect review. Charge can be provided on structures at the positions to be reviewed. For example, the charge can be provided by directing the electron beam on the surface contact point or by scanning the electron-beam over an area including the position to be reviewed. An image can be generated to review the position or area having the potential defect. According to some embodiments, which can be combined with other embodiments described herein, the image can be generated by detecting signal electrons and particularly including voltage contrast information.

Embodiments of the present disclosure provide one or more of the following advantages. A contact free electrical test of packaging substrates as disclosed herein can be provided, wherein electrical charge can be controlled for electrical defect detection. In light of the flexibility of the electron-beam, increased testing speed can be provided. A test including 100% of the electrical interconnection path is possible during volume production. Further, the flexibility of the electron-beam allows for testing and flexible setup for different AP/PLP substrate layouts. The test methods and apparatuses disclosed herein further allow for being scalable to smaller dimensions, particularly if technical development moves towards smaller structure sizes. The testing of the packaging substrates is damage free. Further, embodiments of the present disclosure beneficially provide for a low signal to noise ratio. In particular, since the neutral energy value of the packaging substrate as described herein can be similar to the neutral energy value of the surface contact points as described herein, embodiments of the test method as described herein are relatively insensitive with respect to parasitic charge effects of the packaging substrate.

While the foregoing is directed to some embodiments, other and further embodiments may be devised without departing from the basic scope thereof, and the scope thereof is determined by the claims that follow.

The invention claimed is:

1. A method of testing a substrate with at least one electron beam column, the method comprising:

placing the packaging substrate on a stage in a vacuum chamber;

directing an electron beam of the at least one electron beam column with a landing energy $U_{pe}$, a first beam diameter $BD_1$ and a first impact angle $\theta_1$ on one or more first surface contact points on the packaging substrate;

directing the electron beam with at least one of a second beam diameter $BD_2$ and a second impact angle $\theta_2$ on one or more second surface contact points different from the one or more first surface contact points, wherein at least one of the following applies:

i) the first impact angle $\theta_1$ is different from the second impact angle $\theta_2$, and ii) the second beam diameter $BD_2$ is different from the first beam diameter $BD_1$; and detecting signal electrons (113) emitted upon impingement of the electron beam for testing at least a first device-to-device electrical interconnect path of the packaging substrate;

and further wherein the one or more second surface contact points have a convexly shaped topography with a second diameter $D_2$ and a second apex $AP_2$, particularly a central second apex, and wherein the second relative position is within a second area $A_2$ around the second apex $AP_2$, wherein $[(D_2/2)^2\times\pi-(D_2/4)^2\times\pi]\leq A_2\leq[(D_2/2)^2\times\pi-(D2/8)^2\times\pi]$.

2. The method of claim 1, wherein the first impact angle $\theta_1$ is $0°\leq\theta_1<45°$, and wherein the second impact angle $\theta_2$ is $45°\leq\theta_2\leq 90$.

3. The method of claim 1, wherein the one or more first surface contact points have a first diameter D1 and the first beam diameter $BD_1$ is $BD_1\leq 0.25\times D1$.

4. The method of claim 1, wherein the one or more second surface contact points have a second diameter $D_2$ and the second beam diameter $BD_2$ is $0.5\times D_2<BD_2\leq D_2$.

5. The method of claim 1, wherein the electron beam is directed on a first relative position of the one or more first surface contact points, and wherein the electron beam is directed on a second relative position of the one or more second surface contact points, wherein the second relative position is different from the first relative position.

6. The method of claim 5, wherein the one or more first surface contact points have a convexly shaped topography with a first diameter $D_1$ and a first apex $AP_1$, and wherein the first relative position is within a first area $A_1$ around the first apex $AP_1$, wherein $A_1\leq(D_1/4)^2\times\tau$.

7. The method of claim 1, wherein the landing energy $U_{pe}$ is selected to be $E_{N2}<U_{pe}<E_{N2}'$, wherein $E_{N2}$ is a second neutral energy value corresponding to a landing energy with a total electron yield of 1 for the impact angle θ=0°, and wherein $E_{N2}'$ is the second neutral energy value corresponding to a landing energy with a total electron yield of 1 for the impact angle θ=90°.

8. The method of claim 1, wherein the landing energy $U_{pe}$ is selected to be $E_{N1}'<U_{pe}<E_{N1}$, wherein $E_{N1}$ is a first neutral energy value corresponding to a landing energy with a total electron yield of 1 for the impact angle θ=0°, and wherein $E_{N1}'$ is the first neutral energy value corresponding to a landing energy with a total electron yield of 1 for the impact angle θ=90°.

9. The method of claim 1, further comprising:

scanning the electron beam to the one or more first surface contact points and the one or more second surface contact points on the substrate for charging and for detecting the signal electrons.

10. The method of claim 1, wherein the one or more first surface contact points and the one or more second surface contact points are formed as a metal pad covered by a solder bump having a diameter of 25 μm or less.

11. The method of claim 1, wherein the substrate comprises a plurality of device-to-device electrical interconnect paths extending between respective first surface contact points and second surface contact points, the method further comprising:

testing the plurality of device-to-device electrical interconnect paths sequentially and/or in parallel.

12. The method of claim 1, wherein the substrate comprises 5.000 or more device-to-device electrical interconnect paths which are all tested.

13. The method of claim 1, further comprising:

obtaining information about one or more electric potentials from an energy of the signal electrons; and determining from the information if the first device-to-device electrical interconnect path is defective, and optionally further comprising classifying any determined defect.

14. The method of claim 13, wherein obtaining the information comprises energy filtering the signal electrons.

15. The method of claim 1, wherein the testing comprises determining if the first device-to-device electrical interconnect path has one or more of the following defects: a short, an open, and/or a leakage.

16. The method of claim 1, wherein the substrate is selected from the group consisting of a packaging substrate, a panel level packaging substrate and an advanced packaging substrate.

17. An apparatus for contactless testing of a substrate, comprising: a vacuum chamber; a stage within the vacuum chamber, the stage being configured to support the substrate; a charged particle beam column configured to generate an electron beam, the electron beam column comprising:

an objective lens configured to focus the electron beam on the substrate; a scan deflector configured to scan the electron beam to different positions on the substrate; an electron detector for detecting signal electrons emitted upon impingement of the electron beam on the substrate; and one or more power supplies to provide a landing energy $U_{pe}$ of the electron beam; an analysis unit for determining, based on the signal electrons, if a first device-to-device electrical interconnect path is defective; and a controller configured to control the scan deflector and the objective lens for:

a) directing the electron beam with a first beam diameter $BD_1$ and a first impact angle $\theta_1$ on one or more first surface contact points on the substrate, and b) directing the electron beam with at least one of a second beam diameter $BD_2$ and a second impact angle $\theta_2$ on one or more second surface contact points different from the one or more first surface contact points, wherein at least one of the following applies:

i) the first impact angle $\theta_1$ is different from the second impact angle $\theta_2$, and ii) the second beam diameter $BD_2$ is different from the first beam diameter $BD_1$ and further wherein the one or more second surface contact points have a convexly shaped topography with a second diameter $D_2$ and a second apex $AP_2$, particularly a central second apex, and wherein the second relative position is within a second area $A_2$ around the second apex $AP_2$, wherein $[(D_2/2)^2 \times \pi - (D_2/4)^2 \times \pi] \leq A_2 \leq [(D_2/2)^2 \times \pi - (D2/8)^2 \times \pi]$.

18. The apparatus of claim 17, wherein the electron detector comprises:

an Everhard-Thornley detector; and an energy filter for the signal electrons in front of the Everhard-Thornley detector.

19. The apparatus of any of claim 17, wherein a scan controller is configured to sequentially direct the electron beam to pairs of first and second surface contact points for testing respective device-to-device electrical interconnect paths extending between the respective pairs of first surface contact points and second surface contact points.

* * * * *